United States Patent
Park et al.

(10) Patent No.: US 11,091,694 B2
(45) Date of Patent: Aug. 17, 2021

(54) ETCHING COMPOSITION, METHOD FOR FORMING PATTERN AND METHOD FOR MANUFACTURING A DISPLAY DEVICE USING THE SAME

(71) Applicant: SAMSUNG DISPLAY CO., LTD., Yongin-si (KR)

(72) Inventors: Jonghee Park, Yongin-si (KR); Kitae Kim, Yongin-si (KR); Jinseock Kim, Yongin-si (KR); Gyu-Po Kim, Yongin-si (KR); Hyun-Cheol Shin, Yongin-si (KR); Dae-Woo Lee, Yongin-si (KR); Sang-Hyuk Lee, Yongin-si (KR); Zheng Hong, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 16/579,073

(22) Filed: Sep. 23, 2019

(65) Prior Publication Data
US 2020/0148951 A1    May 14, 2020

(30) Foreign Application Priority Data
Nov. 14, 2018   (KR) .................. 10-2018-0140202

(51) Int. Cl.
| C09K 13/06 | (2006.01) |
| C23F 1/16 | (2006.01) |
| C09G 1/00 | (2006.01) |
| H01L 21/3213 | (2006.01) |

(52) U.S. Cl.
CPC .............. *C09K 13/06* (2013.01); *C23F 1/16* (2013.01); *C09G 1/00* (2013.01); *H01L 21/32134* (2013.01)

(58) Field of Classification Search
CPC .......... C09K 13/06; C09K 13/00; C09G 1/00; C23F 1/10; C23F 1/44; C23F 1/16; H01L 21/02052; H01L 21/32134; H01L 27/32; H01L 51/0017
USPC .... 252/79.1, 79.2, 79.3, 79.4; 438/745, 750; 216/75, 76
See application file for complete search history.

(56) References Cited

U.S. PATENT DOCUMENTS

| 7,141,180 | B2 | 11/2006 | Park et al. | |
| 7,357,878 | B2 | 4/2008 | Park et al. | |
| 8,785,224 | B2 | 7/2014 | Ko et al. | |
| 2010/0330809 | A1* | 12/2010 | Inaba | C23F 3/04 438/693 |
| 2011/0061908 | A1* | 3/2011 | Goto | H01L 51/442 174/257 |
| 2015/0162213 | A1* | 6/2015 | Chen | C23F 1/28 438/754 |

(Continued)

FOREIGN PATENT DOCUMENTS

| JP | 4756069 B2 | 8/2011 |
| JP | 5158339 B2 | 3/2013 |
| KR | 10-0853216 B1 | 8/2008 |

(Continued)

*Primary Examiner* — Lan Vinh
(74) *Attorney, Agent, or Firm* — Kile Park Reed & Houtteman PLLC

(57) ABSTRACT

An etching composition includes an inorganic acid compound, a carboxylic acid compound, a sulfonic acid compound, a glycol compound, a nitrogen-containing dicarbonyl compound, a sulfate compound and water.

20 Claims, 10 Drawing Sheets

(56) References Cited

U.S. PATENT DOCUMENTS

2015/0307818 A1* 10/2015 Barnes .............. H01L 21/02071
510/175
2016/0348001 A1* 12/2016 Shigeta .................. C09K 13/06

FOREIGN PATENT DOCUMENTS

| KR | 10-0993775 B1 | 11/2010 |
|----|----|----|
| KR | 10-1391603 B1 | 4/2014 |
| KR | 10-1459502 B1 | 11/2014 |
| KR | 10-1518055 B1 | 4/2015 |
| KR | 10-1537207 B1 | 7/2015 |
| KR | 10-2015-0089887 A | 8/2015 |
| KR | 10-2016-0115189 A | 10/2016 |
| KR | 10-2016-0122715 A | 10/2016 |
| KR | 10-1695608 B1 | 1/2017 |
| KR | 10-2018-0038593 A | 4/2018 |
| KR | 10-1905195 B1 | 9/2018 |

* cited by examiner

ETCHING COMPOSITION, METHOD FOR FORMING PATTERN AND METHOD FOR MANUFACTURING A DISPLAY DEVICE USING THE SAME

CROSS-REFERENCE TO RELATED APPLICATION

Korean Patent Application No. 10-2018-0140202, filed on Nov. 14, 2018, in the Korean Intellectual Property Office, and entitled: "Etching Composition, Method for Forming Pattern and Method for Manufacturing a Display Device Using the Same," is incorporated by reference herein in its entirety.

BACKGROUND

1. Field

Exemplary embodiments relate to an etching composition. Exemplary embodiments relate to an etching composition, a method for forming a pattern and a method for manufacturing a display device using the etching composition.

2. Description of the Related Art

An organic light-emitting display device is able to emit a light by itself. Organic light-emitting display device may have a reduced weight and thickness and may have characteristics appropriate for a flexible display device. Usage of the organic light-emitting display device has increased.

SUMMARY

Embodiments are directed to an etching composition, comprising an inorganic acid compound, a carboxylic acid compound, a sulfonic acid compound, a glycol compound, a nitrogen-containing dicarbonyl compound, a sulfate compound and water.

The inorganic acid compound may include at least one selected from nitric acid ($HNO_3$), sulfuric acid ($H_2SO_4$) and hydrochloric acid (HCl).

The carboxylic acid compound may include at least one selected from acetic acid, ($CH_3CO_2H$), malic acid ($C_4H_6O_5$), citric acid ($C_6H_8O_7$), tartaric acid ($C_4H_6O_6$), lactic acid ($C_3H_6O_3$), formic acid ($CH_2O_2$), succinic acid ($C_4H_6O_4$) and fumaric acid ($C_4H_4O_4$).

The sulfonic acid compound may include at least one selected from methanesulfonic acid ($CH_3SO_3H$), p-toluenesulfonic acid ($CH_3C_6H_4SO_3H$), benzenesulfonic acid ($C_6H_5SO_3H$), amino methylsulfonic acid ($CH_5NO_3S$) and sulfamic acid ($H_3NSO_3$).

The glycol compound may include at least one selected from diethylene glycol ($C_4H_{10}O_3$), ethylene glycol ($HOCH_2CH_2OH$), glycolic acid ($CH_2OHCOOH$), propylene glycol ($C_3H_8O_2$) and triethylene glycol ($C_6H_{14}O_4$).

The nitrogen-containing dicarbonyl compound may include at least one selected from iminodiacetic acid ($C_4H_7NO_4$), imidazolidine-2,4-dione ($C_3H_4N_2O_2$), succinimide ($C_4H_5NO_2$), glutarimide ($C_5H_7NO_2$), glycine ($C_2H_5NO_2$), asparagine ($C_4H_8N_2O_3$), glutamic acid ($C_5H_9NO_4$), aspartic acid ($C_4H_7NO_4$), pyro-glutamic acid ($C_5H_7NO_3$) and hippuric acid ($C_9H_9NO_3$).

The sulfate compound may include at least one selected from ammonium hydrogen sulfate (($NH_4$)$HSO_4$), ammonium sulfate (($NH_4$)$_2SO_4$), potassium hydrogen sulfate ($KHSO_4$), potassium sulfate ($K_2SO_4$), sodium hydrogen sulfate ($NaHSO_4$) and sodium sulfate ($Na_2SO_4$).

The etching composition as claimed in claim 1 may include 8.1 wt % to 9.9 wt % of the inorganic acid compound, 40 wt % to 55 wt % of the carboxylic acid compound, 1 wt % to 4.9 wt % of the sulfonic acid compound, 1 wt % to 5 wt % of the glycol compound, 2 wt % to 10 wt % of the nitrogen-containing dicarbonyl compound, 1 wt % to 15 wt % of the sulfate compound, and the remainder of water.

The etching composition may be capable of etching a silver-containing thin film.

The etching composition may be capable of etching a multiple layer structure including a silver-containing thin film and a metal oxide thin film, the metal oxide thin film including at least one selected from indium oxide, zinc oxide, tin oxide, indium tin oxide, indium zinc oxide and zinc tin oxide.

The inorganic acid compound may include nitric acid; the carboxylic acid compound may include acetic acid and citric acid; the sulfonic acid compound may include methanesulfonic acid; the glycol compound may include glycolic acid; the nitrogen-containing dicarbonyl compound includes imidazolidine-2,4-dione and pyro-glutamic acid; and the sulfate compound includes sodium hydrogen sulfate.

The nitrogen-containing dicarbonyl compound may include imidazolidine-2,4-dione and pyro-glutamic acid with the weight ratio of 2:1 to 1:2.

Embodiments are also directed to a method for forming a pattern, including forming a multiple layer structure including a silver-containing thin film and a metal oxide thin film, and etching the multiple layer structure using an etching composition including an inorganic acid compound, a carboxylic acid compound, a sulfonic acid compound, a glycol compound, a nitrogen-containing dicarbonyl compound, a sulfate compound and water.

The multiple layer structure may include a lower layer including a metal oxide, an intermediate layer on the lower layer, the intermediate layer including silver or a silver alloy, and an upper layer on the intermediate layer, the upper layer including a metal oxide.

The etching composition may include 8.1 wt % to 9.9 wt % of the inorganic acid compound, 40 wt % to 55 wt % of the carboxylic acid compound, 1 wt % to 4.9 wt % of the sulfonic acid compound, 1 wt % to 5 wt % of the glycol compound, 2 wt % to 10 wt % of the nitrogen-containing dicarbonyl compound, 1 wt % to 15 wt % of the sulfate compound, and the remainder of water.

Embodiments are also directed to a method for manufacturing a display device, including forming an active pattern in a display area on a base substrate; forming a gate metal pattern including a gate electrode overlapping the active pattern; forming a source metal pattern including a connection pad disposed in a peripheral area surrounding the display area; forming a multiple layer structure including a silver-containing thin film and a metal oxide thin film; and etching the multiple layer structure using an etching composition including an inorganic acid compound, a carboxylic acid compound, a sulfonic acid compound, a glycol compound, a nitrogen-containing dicarbonyl compound, a sulfate compound and water to form an electrode pattern in the display area and to expose the connection pad.

The source metal pattern may be a single-layer structure or a multiple-layer structure that includes aluminum.

The multiple layer structure may include a lower layer including a metal oxide, an intermediate layer disposed on the lower layer and including silver or a silver alloy, and an upper layer disposed on the intermediate layer and including a metal oxide, wherein the metal oxide includes at least one selected from the group consisting of indium oxide, zinc oxide, tin oxide, indium tin oxide, indium zinc oxide and zinc tin oxide.

The etching composition may include 8.1 wt % to 9.9 wt % of the inorganic acid compound, 40 wt % to 55 wt % of the carboxylic acid compound, 1 wt % to 4.9 wt % of the sulfonic acid compound, 1 wt % to 5 wt % of the glycol compound, 2 wt % to 10 wt % of the nitrogen-containing dicarbonyl compound, 1 wt % to 15 wt % of the sulfate compound, and the remainder of water.

The method may further include connecting a driving chip, which generates a driving signal, to the connection pad.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
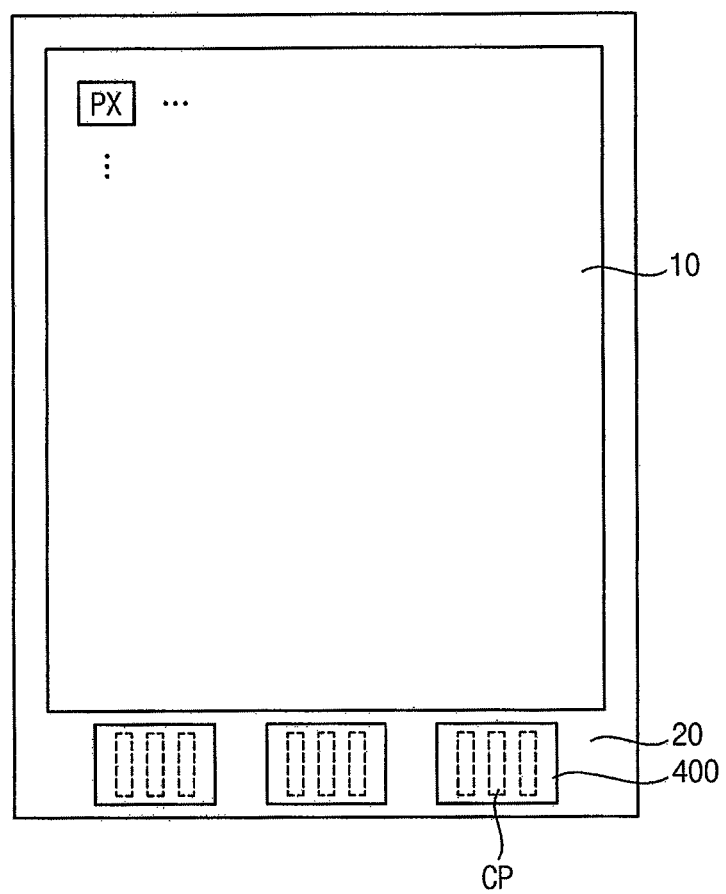
FIG. 1 illustrates a plan view illustrating a display device manufactured according to an exemplary embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

An etching composition, a method for forming a pattern and a method for manufacturing a display device according to exemplary embodiments of the present inventive concept will be described hereinafter.

Etching Composition

An etching composition according to an exemplary embodiment may include an inorganic acid compound, a carboxylic acid compound, a sulfonic acid compound, a glycol compound, a nitrogen-containing dicarbonyl compound, a sulfate compound, and water.

The etching composition may be used for etching a silver-containing thin film including silver or a silver alloy. The etching composition may be also used for etching a metal oxide thin film. The etching composition may be also used for etching a silver-containing thin film and a metal oxide thin film in a multiple layer structure.

The multiple layer may include, for example, a lower layer including a metal oxide, an intermediate layer disposed on the lower layer and including silver or a silver alloy, and an upper layer disposed on the intermediate layer and including a metal oxide. For example, the metal oxide of the upper and lower layers may include indium oxide, zinc oxide, tin oxide, indium tin oxide, indium zinc oxide, zinc tin oxide, or the like. In an exemplary embodiment, the lower layer and the upper layer may include indium tin oxide. In some implementations, compositions according to exemplary embodiments may be used for etching a multiple layer structure having various structures such as a double layer of a silver-containing thin film and a metal oxide thin film.

The inorganic acid compound may function as a main oxidizer for a silver component. The inorganic acid compound may be decomposed by reacting with silver in an etching process.

In an exemplary embodiment, the content of the inorganic acid compound may be 8.1 wt % to 9.9 wt %, or, for example, 9.0 wt % to 9.9 wt %. When the content of the inorganic acid compound is less than 9.9 wt %, the etching rate and the etching degree may be controllable such that over-etching of a target thin film may be avoided. When the content of the inorganic acid compound is greater than 8.1 wt %, the etching rate may sufficient so that etching for the silver-containing thin film may be sufficiently performed.

Examples of the inorganic acid compound may include nitric acid ($HNO_3$), sulfuric acid ($H_2SO_4$), hydrochloric acid (HCl), or the like. These may be used each alone or in combination thereof.

The carboxylic acid compound may function as a co-oxidizer for the silver component. The carboxylic acid compound may decrease the decomposition rate of the inorganic acid compound so that the etching rate of the silver-containing thin film may be kept constant.

In an exemplary embodiment, the content of the carboxylic acid compound may be 40 wt % to 55 wt %, or, for example, 42 wt % to 52 wt %. When the content of the carboxylic acid compound is less than 55 wt %, an excessive increase of the etching rate of the silver-containing thin film, which could cause erosion defects, may be avoided. When the content of the carboxylic acid compound is greater than 40 wt %, an increase in the decomposition rate of the inorganic acid compound, deterioration of the stability of the etching composition, and generation of an etching residue may be avoided.

Examples of the carboxylic acid compound may include acetic acid, ($CH_3CO_2H$), malic acid ($C_4H_6O_5$), citric acid ($C_6H_8O_7$), tartaric acid ($C_4H_6O_6$), lactic acid ($C_3H_6O_3$), formic acid ($CH_2O_2$), succinic acid ($C_4H_6O_4$), fumaric acid ($C_4H_4O_4$). or the like. These may be used each alone or in combination thereof.

In an exemplary embodiment, the carboxylic acid compounds may include at least two substances. For example, the carboxylic acid compounds may include acetic acid and citric acid. Acetic acid has excellent performance as a co-oxidizer, but has a high volatility. In an exemplary embodiment, addition of citric acid may relatively reduce the content of acetic acid to improve the stability of the etching composition. In addition, citric acid has a chelating effect on silver ions. Accordingly, reductive precipitation of silver ions may be prevented. The etching composition may include, for example, 20 wt % to 30 wt % of acetic acid and 20 wt % to 25 wt % of citric acid.

The sulfonic acid compound may function as a co-oxidizer for the silver component. The sulfonic acid compound may increase the etching rate and may prevent etching residue. In addition, the sulfonic acid compound may decrease the decomposition rate of the inorganic acid compound so that the etching rate of the silver-containing thin film may be kept constant.

In an exemplary embodiment, the content of the sulfonic acid compound may be 1 wt % to 4.9 wt %, or, for example, 2 wt % to 4.9 wt %. When the content of the sulfonic acid compound is less than 4.9 wt %, an excessive increase in the etching rate of the silver-containing thin film, which could cause corrosion defects, may be avoided. When the content of the sulfonic acid compound is greater than 1 wt %, the decomposition rate of the inorganic acid compound may be decreased. Thus, instability of the etching composition and generation of an etching residue may be avoided.

Examples of the sulfonic acid compound may include methanesulfonic acid ($CH_3SO_3H$), p-toluenesulfonic acid ($CH_3C_6H_4SO_3H$), benzenesulfonic acid ($C_6H_5SO_3H$), amino methylsulfonic acid ($CH_5NO_3S$), sulfamic acid ($H_3NSO_3$), or the like. These may be used each alone or in combination thereof.

The glycol compound may interact with the sulfonic compound to increase acidity of the etching composition thereby preventing etching residue of silver. In addition, the glycol compound may prevent heat generation or evaporation due to reaction between components thereby increasing stability and reliability over time for the etching composition.

In an exemplary embodiment, the content of the glycol compound may be 1 wt % to 5 wt % or, for example, 2 wt % to 4 wt %. When the content of the glycol compound is less than 5 wt %, an excessive increase of the etching rate of the silver-containing thin film, which could cause erosion defects, may be avoided. When the content of the glycol compound is greater than 1 wt %, an excessive decrease in the etching rate of the silver-containing thin film, which could cause an etching residue to be formed, may be avoided.

Examples of the glycol compound may include diethylene glycol ($C_4H_{10}O_3$), ethylene glycol ($HOCH_2CH_2OH$), glycolic acid ($CH_2OHCOOH$), propylene glycol ($C_3H_8O_2$), triethylene glycol ($C_6H_{14}O_4$), or the like. These may be used each alone or in combination thereof.

The nitrogen-containing dicarbonyl compound may control etching of the silver-containing thin film. For example, the nitrogen-containing dicarbonyl compound may effectively form a complex with a metal component to prevent excessive increase of cut-dimension (CD) skew. Thus, CD-skew may be maintained with respect to a content change of silver. Thus, the stability of the etching composition for cumulative use may be improved.

In addition, when other metal layers including an aluminum thin film and a titanium thin film are exposed in the etching process using the etching composition, damage of the aluminum may be prevented. Thus, reductive precipitation of silver due to the aluminum damage and titanium tip may be suppressed.

In an exemplary embodiment, the content of the nitrogen-containing dicarbonyl compound may be 2 wt % to 10 wt %, or, for example, 3 wt % to 9 wt %. When the content of the nitrogen-containing dicarboxylic carbonyl compound is less than 10 wt %, an excessive reduction of the etching rate may be avoided. Thus, CD-skew may be formed, and the generation of etching residues may be avoided. When the content of the nitrogen-containing dicarbonyl compound is greater than 2 wt %, an excess formation of CD-skew may be avoided, and a deterioration of reliability over time may be avoided.

Examples of the nitrogen-containing dicarbonyl compound may include iminodiacetic acid ($C_4H_7NO_4$), imidazolidine-2,4-dione ($C_3H_4N_2O_2$), succinimide ($C_4H_5NO_2$), glutarimide ($C_5H_7NO_2$), glycine ($C_2H_5NO_2$), asparagine ($C_4H_8N_2O_3$), glutamic acid ($C_5H_9NO_4$), aspartic acid ($C_4H_7NO_4$), pyro-glutamic acid ($C_5H_7NO_3$), hippuric acid ($C_9H_9NO_3$), or the like. These may be used each alone or in combination thereof.

In an exemplary embodiment, the nitrogen-containing dicarbonyl compound may include at least two substances. For example, the nitrogen-containing dicarbonyl compound may include imidazolidin-2,4-dione and pyro-glutamic acid. Imidazolidin-2,4-dione may have an etch-stop effect to prevent excessive CD-skew and may have a chelating effect on silver. Pyro-glutamic acid may protect aluminum, thereby suppressing reductive precipitation of silver and titanium tip. The weight ratio of imidazolidin-2,4-dione and pyro-glutamic acid may be, for example, 2:1 to 1:2.

The sulfate compound may function as a main oxidizer for a metal oxide such as indium tin oxide or the like. If the etching composition were to not include the sulfate compound, a multiple layer structure including a metal oxide might be barely etched.

In an exemplary embodiment, the content of the sulfate compound may be 1 wt % to 15 wt %, or, for example, 2 wt % to 13 wt %. When the content of the sulfate compound is less than 15 wt %, an excessive increase in the etching rate of the metal oxide thin film, which could cause erosion defects, may be avoided. When the content of the sulfate compound is greater than 1 wt %, the etching rate of the metal oxide thin film may be sufficient to avoid causing etching residue of metal oxide and silver.

Examples of the sulfate compound may include ammonium hydrogen sulfate (($NH_4$)$HSO_4$), ammonium sulfate (($NH_4$)$_2SO_4$), potassium hydrogen sulfate ($KHSO_4$), potassium sulfate ($K_2SO_4$), sodium hydrogen sulfate ($NaHSO_4$), sodium sulfate, ($Na_2SO_4$), or the like. These may be used each alone or in combination thereof. The sulfate compound may include, for example, hydrogen sulfate compounds such as ammonium hydrogen sulfate, potassium hydrogen sulfate, sodium hydrogen sulfate, or the like.

The content of water may correspond to the remainder in the etching composition excluding the contents of the inorganic acid compound, the carboxylic acid compound, the sulfonic acid compound, the glycol compound, the nitrogen-containing dicarbonyl compound and the sulfate compound. As an example, ultrapure water or water having grade for manufacturing a semiconductor may be used.

In some implementations, the etching composition may be substantially free of phosphoric acid, which can cause damage to metals such as aluminum, instead of protecting such metals. In addition, phosphoric acid could increase a reductive precipitation of silver, thereby increasing manufacturing defects.

In an exemplary embodiment, the etching composition may include nitric acid, acetic acid, citric acid, methanesulfonic acid, glycolic acid, imidazolidin-2,4-dione, pyro-glutamic acid, sodium hydrogen sulfate and the remainder of water.

An etching composition according to exemplary embodiments may etch a multiple layer structure including a silver-containing thin film and a metal oxide thin film. The etching composition may prevent excessive increase of CD-skew and generation of etching residue. The etching compositions may prevent excessive increase of CD-skew and etching residue and may prevent the generation of silver particles due to reduction of silver ions. Therefore, manufacturing defects may be prevented and/or minimized.

Method for Manufacturing a Display Device

FIG. 1 illustrates is a plan view of a display device manufactured according to an exemplary embodiment. FIGS. 2 to 9 illustrate cross-sectional views of stages of a method for manufacturing a display device according to an exemplary embodiment. FIG. 10 illustrates a cross-sectional view of a display device manufactured according to an exemplary embodiment.

Referring to FIG. 1, a display device 100 may include a display area 10 and a peripheral area 20 surrounding the display area 10.

Connection pads CP electrically connected to an external device may be disposed in the peripheral area 20. For example, the connection pads CP may be connected to a driving chip 400 that provides a driving signal such as a data signal, a gate signal or the like. The driving signal provided by the driving chip 400 may be transferred to pixels PX in the display area 10 through the connection pads CP.

In an exemplary embodiment, the display device 100 may be an organic light-emitting display device. For example, an array of the pixels PX may be disposed in the display area 10, and each of the pixels PX may include an organic light-emitting diode and a circuit part for driving the organic light-emitting diode.

Figure 2:
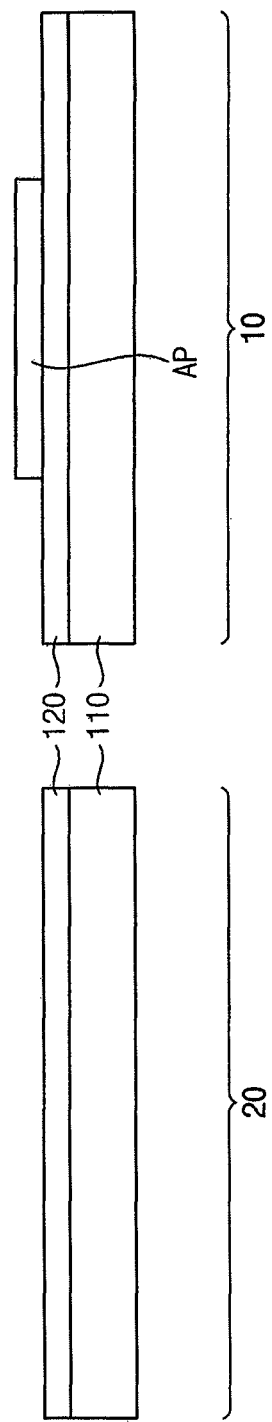
FIGS. 2 to 9 illustrate cross-sectional views illustrating a method for manufacturing a display device according to an exemplary embodiment.

Referring to FIG. 2, a buffer layer 120 may be formed on a base substrate 110.

The base substrate 110 may include, for example, glass, quartz, silicon, a polymer or the like. For example, the polymer may include polyethylene terephthalate, polyethylene naphthalate, polyether ketone, polycarbonate, polyarylate, polyether sulfone, polyimide or a combination thereof.

The buffer layer 120 may prevent or reduce penetration of impurities, humidity or external gas from underneath of the base substrate 110 and may planarize an upper surface of the base substrate 110. The buffer layer 120 may include, for example, an inorganic material such as oxide, nitride or the like.

An active pattern AP may be formed on the buffer layer 120 in the display area 10.

The active pattern AP may include, for example, a semiconductive material such as amorphous silicon, polycrystalline silicon (polysilicon), a metal oxide or the like. The active pattern AP may include polysilicon. At least a portion of the active pattern AP including polysilicon may be doped with impurities such as n-type impurities or p-type impurities.

Figure 3:
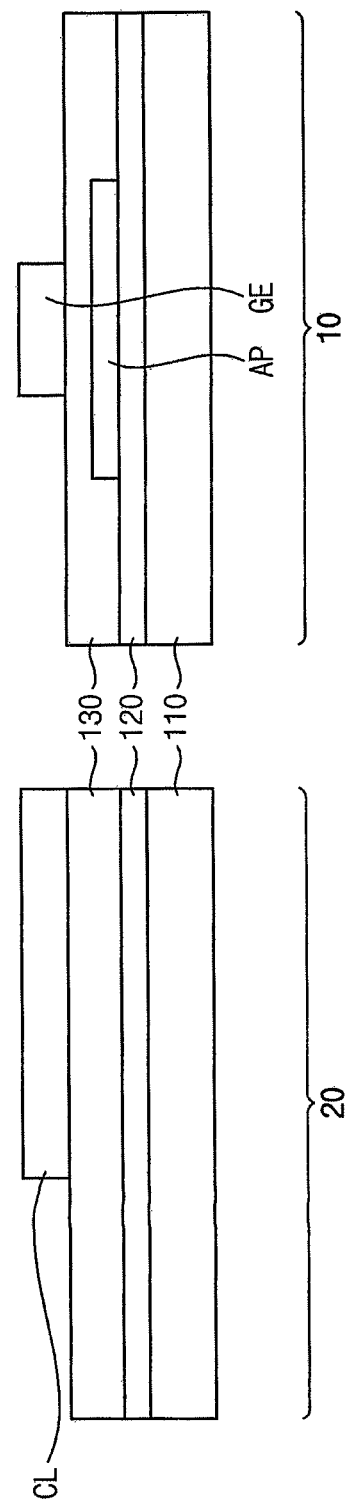

Referring to FIG. 3, a first insulation layer 130 may be formed on the active pattern AP. The first insulation layer 130 may include, for example, silicon oxide, silicon nitride, silicon carbide or a combination thereof. In addition, the first insulation layer 130 may include an insulating metal oxide such as aluminum oxide, tantalum oxide, hafnium oxide, zirconium oxide, titanium oxide or the like. The first insulation layer 130 may have a single-layer structure or a multiple-layer structure including, for example, silicon nitride and/or silicon oxide.

A gate metal pattern including a gate electrode GE and a connection line CL may be formed on the insulation layer 130.

The gate metal pattern may include, for example, gold (Au), silver (Ag), aluminum (Al), copper (Cu), nickel (Ni), platinum (Pt), magnesium (Mg), chromium (Cr), tungsten (W), molybdenum (Mo), titanium (Ti), tantalum (Ta) or an alloy thereof. The gate metal pattern and may have a single-layer structure or a multiple-layer structure including different metal layers.

The connection line CL may be disposed in the peripheral area 20 and may extend into the display area 10.

In an exemplary embodiment, after the gate electrode GE is formed, a portion of the active pattern AP may be doped with impurities through an ion-implantation process.

Figure 4:
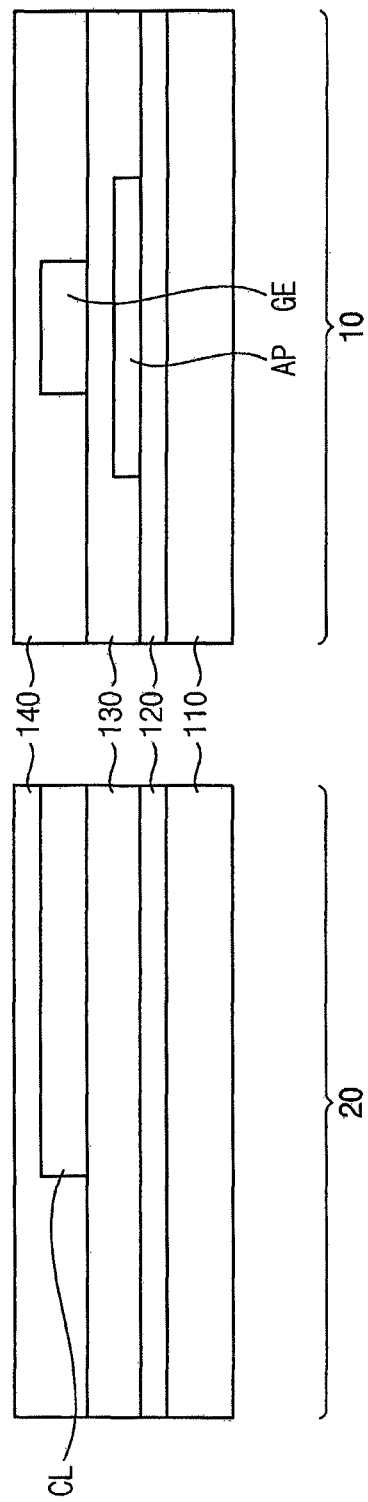

Referring to FIG. 4, a second insulation layer 140 may be formed to cover the gate metal pattern and the first insulation layer 130.

The second insulation layer 140 may include, for example, silicon oxide, silicon nitride, silicon carbide or a combination thereof. The second insulation layer 140 may include an insulating metal oxide such as aluminum oxide, tantalum oxide, hafnium oxide, zirconium oxide, titanium oxide or the like. The second insulation layer 140 has, for example, a single-layer structure or a multiple-layer structure including silicon nitride and/or silicon oxide.

Figure 5:
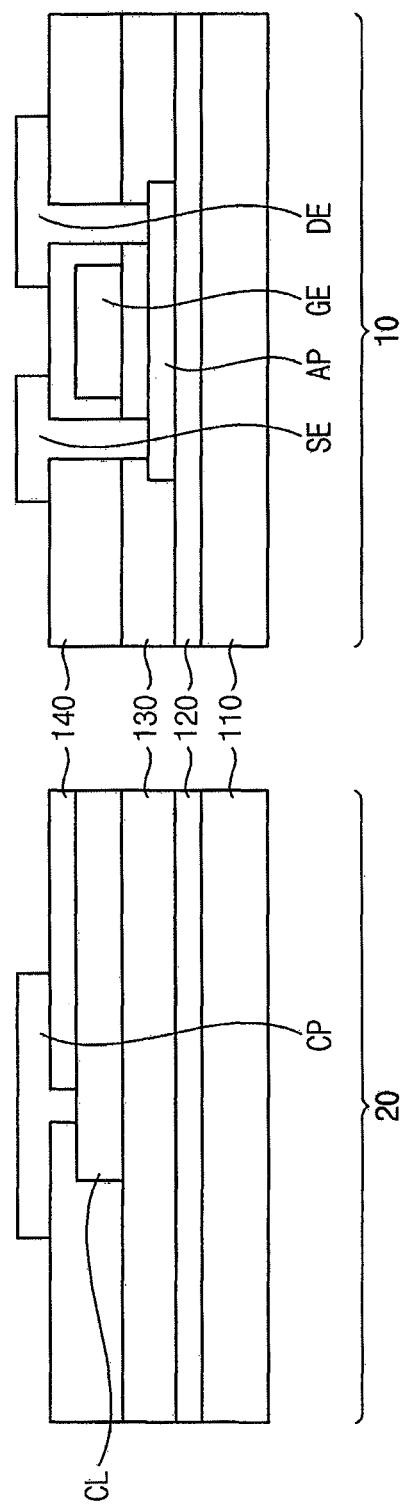

Referring to FIG. 5, a source metal pattern including a source electrode SE, a drain electrode DE and a connection pad CP may be formed on the second insulation layer 140.

The source electrode SE and the drain electrode DE may respectively pass through the first and second insulation layers 130 and 140 to contact the active pattern AP.

The connection pad CP may be disposed in the peripheral area 20. The connection pad CP may pass through the second insulation layer 140 to contact the connection line CL.

The source metal pattern may include, for example, gold (Au), silver (Ag), aluminum (Al), copper (Cu), nickel (Ni), platinum (Pt), magnesium (Mg), chromium (Cr), tungsten (W), molybdenum (Mo), titanium (Ti), tantalum (Ta) or an alloy thereof. The source metal pattern may have a single-layer structure or a multiple-layer structure including different metal layers. In an exemplary embodiment, the source metal pattern may include aluminum. For example, the source metal pattern may have a double-layer structure of titanium/aluminum or a triple-layer structure of titanium/aluminum/titanium.

Figure 6:
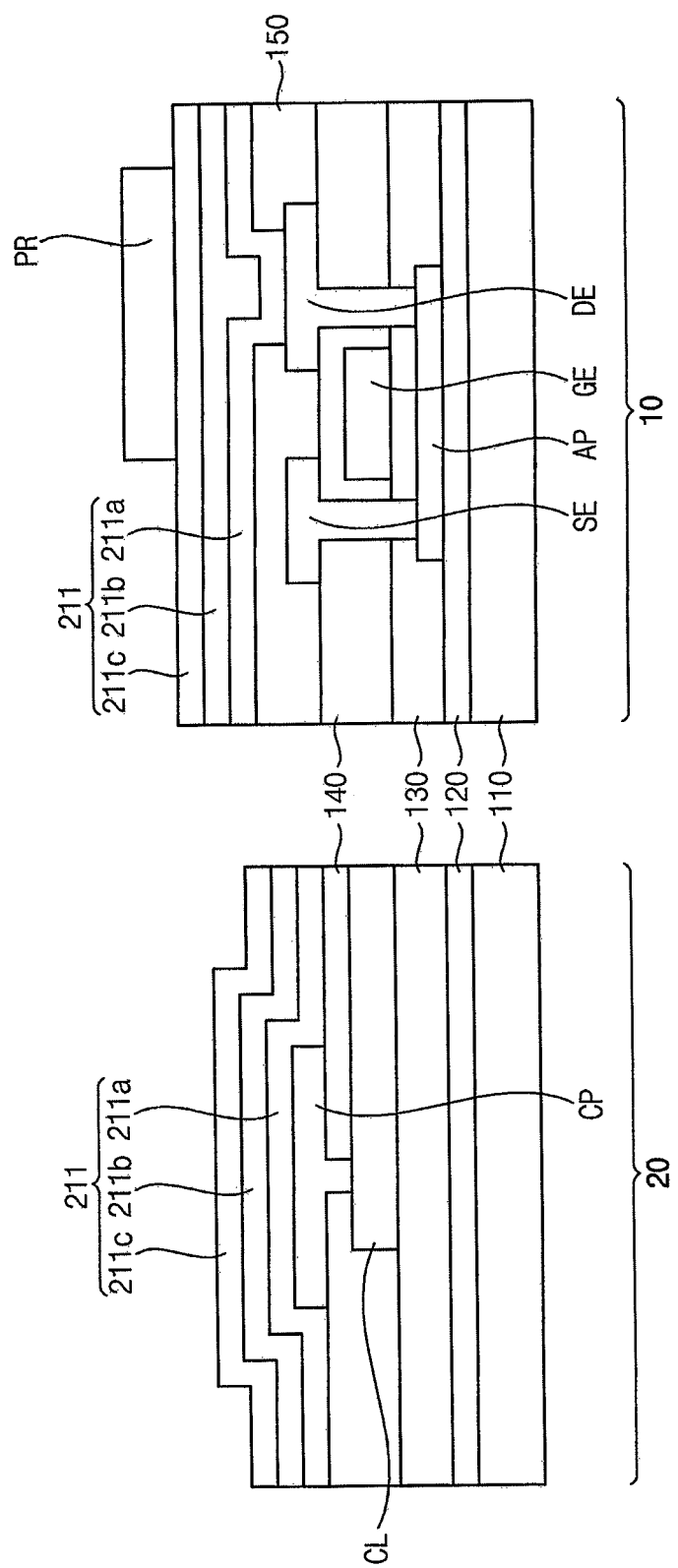

Referring to FIG. 6, a third insulation layer 150 is formed to cover the source electrode SE and the drain electrode DE in the display area 10. In an exemplary embodiment, the connection pad CP in the peripheral area 20 may not be covered by the third insulation layer 150 so that an entire upper surface may be exposed. The third insulation layer 150 may include an opening exposing at least a portion of the drain electrode DE.

The third insulation layer 150 may include, for example, an inorganic insulation material, an organic insulation material or a combination thereof. The organic insulation material may include, for example, a phenol resin, an acryl resin, a polyimide resin, a polyamide resin, an epoxy resin, benzocyclobutene or the like.

A lower electrode layer 211 may be formed on the connection pad CP and on the third insulation layer 150. The lower electrode layer 211 may include a metal, a metal alloy, a metal oxide or a combination thereof.

For example, the lower electrode layer 211 may have a multiple-layer structure including a metal oxide layer and a metal layer. The metal oxide layer may include indium oxide, zinc oxide, tin oxide, indium tin oxide, indium zinc oxide, zinc tin oxide or the like. The metal layer may include gold (Au), silver (Ag), aluminum (Al), copper (Cu), nickel (Ni), platinum (Pt), magnesium (Mg), chromium (Cr), tungsten (W), molybdenum (Mo), titanium (Ti), tantalum (Ta) or an alloy thereof.

In an exemplary embodiment, the lower electrode layer 211 may have a multiple-layer structure including a lower layer 211a, an intermediate layer 211b and an upper layer 211c. In an exemplary embodiment, the lower layer 211a and the upper layer 211c may include indium tin oxide, and the intermediate layer 211b may include silver.

The lower electrode layer 211 may contact the drain electrode DE through the opening of the third insulation layer 150. A photoresist pattern PR overlapping the drain electrode DE may be formed on the lower electrode layer 211.

Figure 7:
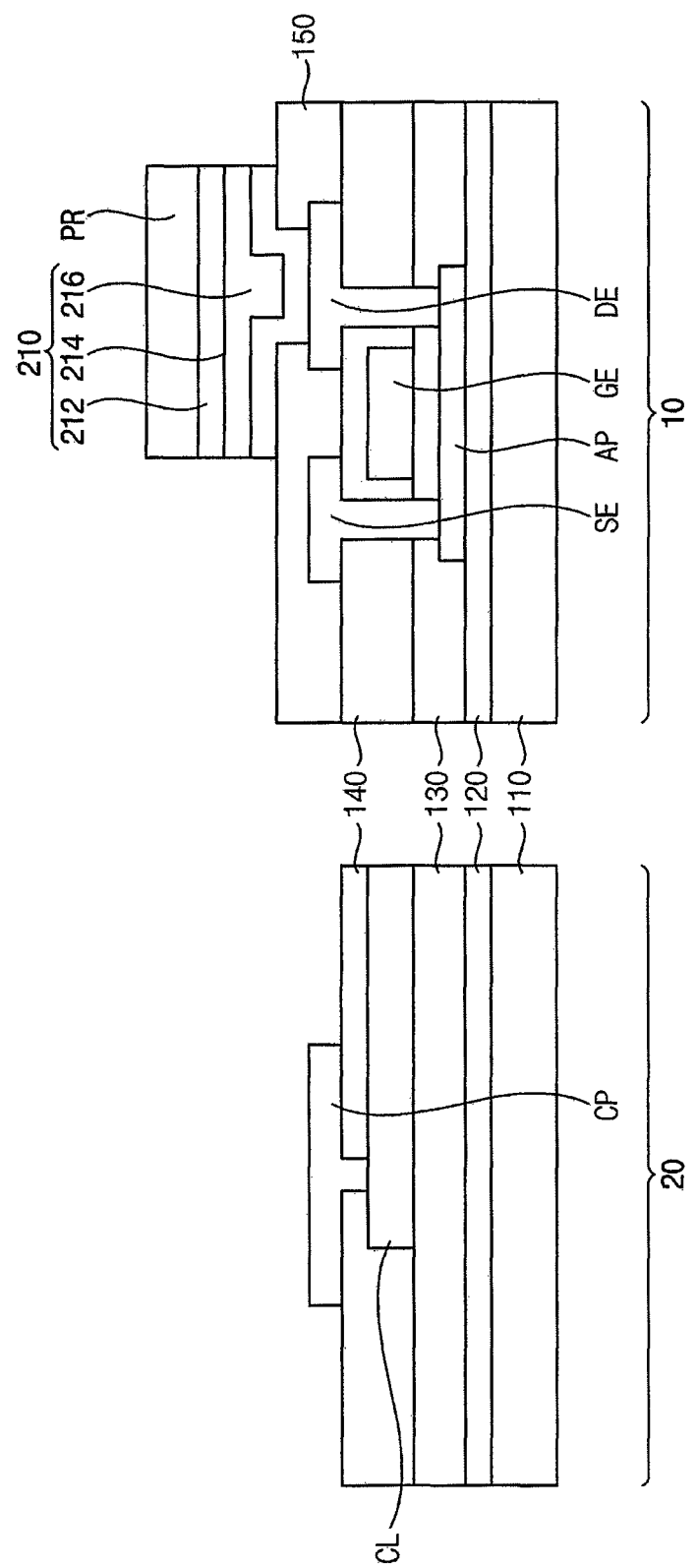

Referring to FIG. 7, the lower electrode layer 211 may be etched to form a lower electrode 210 including a lower pattern 212, an intermediate pattern 214 disposed on the lower pattern 212 and an upper pattern 216 disposed on the intermediate pattern 214. The lower pattern 212 and the upper pattern 216 may include a metal oxide, and the intermediate pattern 214 may include silver.

In an exemplary embodiment, the lower layer 211a, the intermediate layer 211b and the upper layer 211c of the lower electrode layer 211 may be etched using a same etching composition.

In an exemplary embodiment, the etching composition may have a same composition as the previously explained etching composition for a silver-containing thin film. For example, the second etching composition may include an inorganic acid compound, a carboxylic acid compound, a sulfonic acid compound, a glycol compound, a nitrogen-containing dicarbonyl compound, a sulfate compound, and water.

In an exemplary embodiment, the lower electrode 210 may be an anode of an organic light-emitting diode. The remainder of the lower electrode layer 211 excluding the lower electrode 210 may be removed to expose the connection pad CP.

Figure 8:
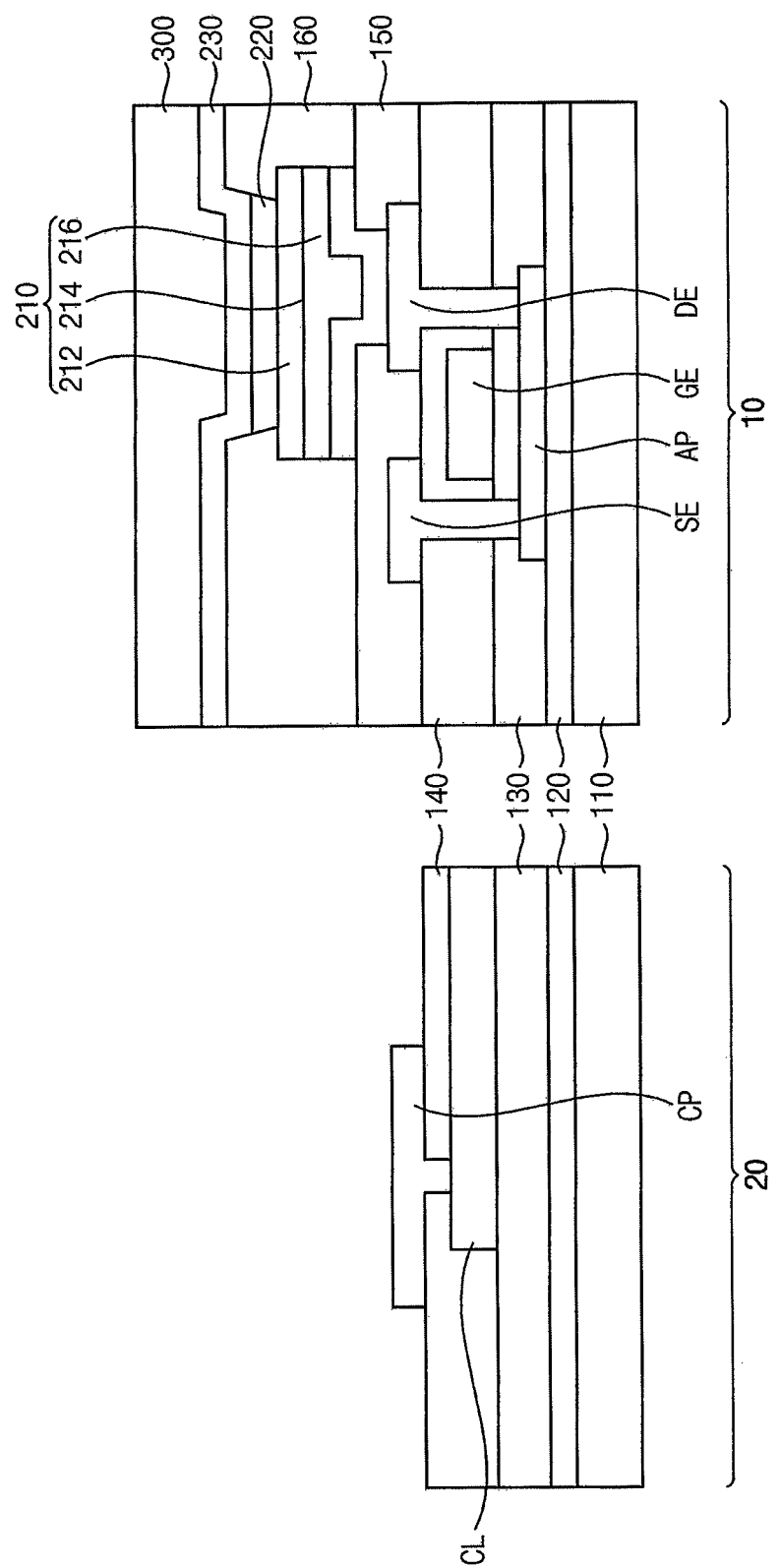

Referring to FIG. 8, a pixel-defining layer 160 may be formed on the third insulation layer 150. The pixel-defining layer 160 may include an opening that exposes at least a portion of the lower electrode 210. For example, the pixel-defining layer 160 may include an organic insulation material.

An organic light-emitting layer 220 may be formed on the lower electrode 210. For example, the organic light-emitting layer 220 may be disposed in the opening of the pixel-defining layer 160. In some implementations, the organic light-emitting layer 220 may extend over an upper surface of the pixel-defining layer 160 or may continuously extend over a plurality of the pixels in the display area 10.

The organic light-emitting layer 220 may include at least a light-emitting layer and may further include at least one of a hole-injection layer (HIL), a hole-transporting layer (HTL), an electron-transporting layer (ETL) and an electron-injection layer (EIL). For example, the organic light-emitting layer 220 may include a low molecular weight organic compound or a high molecular weight organic compound.

In an exemplary embodiment, the organic light-emitting layer 220 may emit red light, green light or blue light. In some exemplary implementations, the organic light-emitting layer 220 may emit white light. The organic light-emitting layer 220 emitting a white light may have a multiple-layer structure including a red-emitting layer, a green-emitting layer and a blue-emitting layer, or a single-layer structure including a mixture of a red-emitting material, a green-emitting material and a blue-emitting material.

An upper electrode 230 may be formed on the organic light-emitting layer 220. In an exemplary embodiment, the upper electrode 230 may continuously extend over a plurality of the pixels in the display area 10.

In an exemplary embodiment, the upper electrode 230 may function as a cathode. For example, the upper electrode 230 may be formed as a transmitting electrode or a reflecting electrode according to an emission type of the display device. For example, when the upper electrode 230 is a transmitting electrode, the upper electrode 230 may include lithium (Li), calcium (Ca), lithium fluoride (LiF), aluminum (Al), magnesium (Mg), or a combination thereof, and the display device may further include a sub electrode or a bus electrode line, which includes indium tin oxide, indium zinc oxide, zinc tin oxide, indium oxide, zinc oxide, tin oxide or the like.

In an exemplary embodiment, a thin-film encapsulation layer 300 may be formed on the upper electrode 230. The thin-film encapsulation layer 300 may have a stack structure of an inorganic layer and an organic layer.

In some implementations, a capping layer and a blocking layer may be disposed between the upper electrode 230 and the thin-film encapsulation layer 300.

Figure 9:
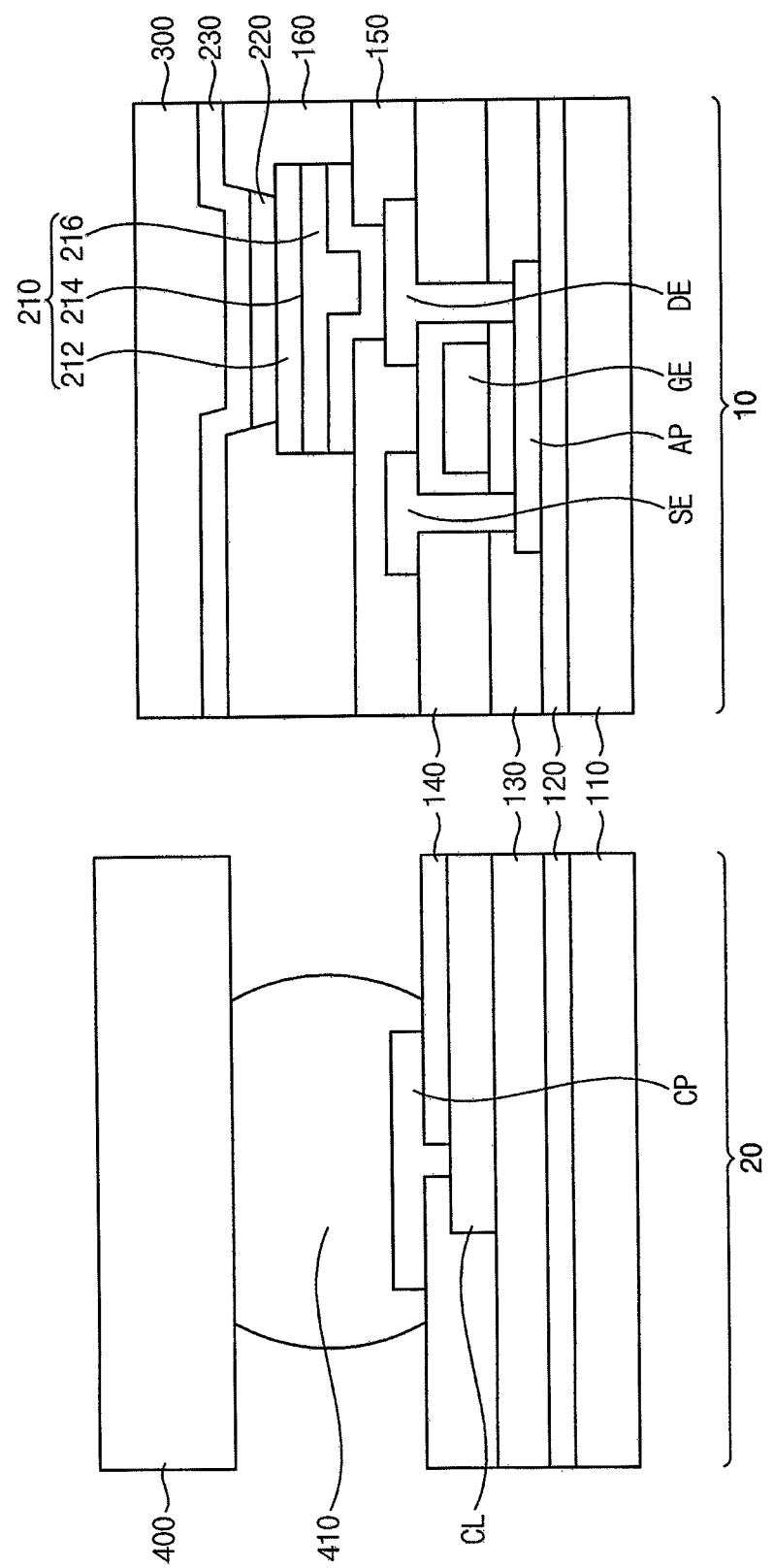
Figure 10:
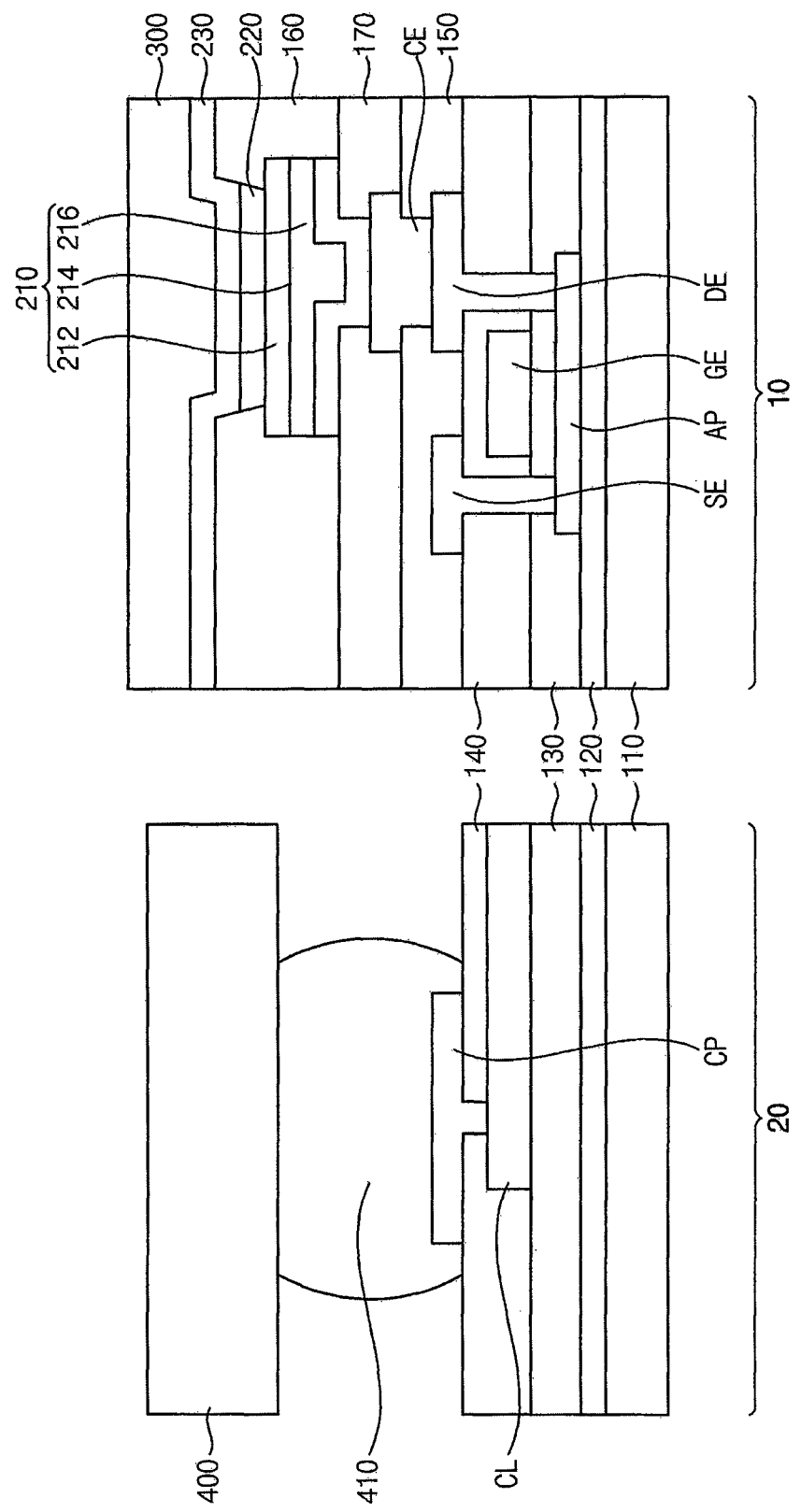
FIG. 10 illustrates a cross-sectional view illustrating a display device manufactured according to an exemplary embodiment.

Referring to FIG. 9, the connection pad CP may be connected to a driving chip 400. The connection pad CP may be connected to the driving chip 400 through, for example, a conductive bump 410.

The connection pad CP formed in the peripheral of the display device may be exposed without a passivation layer covering the connection pad CP in the process of etching the lower electrode layer. Thus, if a conventional etching composition including phosphoric acid were to be used, silver particles could be generated due to the exposed connection pad CP. The silver particles could be transferred to the lower electrode in the following processes including a stripping process, a rinsing process or the like, thereby causing defects of the display device.

Etching compositions according to exemplary embodiments may prevent damage of other metal layers including aluminum or the like when etching a multiple layer structure including a metal oxide layer and a silver-containing layer and may prevent reductive precipitation of silver particles.

In addition, when etching the multiple layer structure, the etching composition may prevent the formation of etching residues and may form a CD-skew having appropriate length.

In addition, the stability of the etching compositions for cumulative use and over time may be improved.

Thus, defects in manufacturing processes for a display device may be reduced, and the reliability of the display device may be improved.

In an exemplary embodiment, a lower electrode of an organic light-emitting diode may contact a drain electrode. In some implementations, as illustrated in FIG. 10, a lower electrode 210 of an organic light-emitting diode 200 may be electrically connected to a drain electrode DE through a connection electrode CE. The connection electrode CE may pass through a third insulation layer 150 to contact the drain electrode DE. A fourth insulation layer 170 may be disposed between the third insulation layer 150 and a pixel-defining layer 160, and the lower electrode 210 may pass through the fourth insulation layer 170 to contact the connection electrode CE.

In an exemplary embodiment, a connection pad CP disposed in the peripheral area 20 and electrically connected to a driving chip 400 through a conductive bump 410 may be formed from a same layer as the drain electrode DE. In some implementations, the connection pad CP may be formed from a same layer as the connection electrode CE.

Hereinafter, effects of exemplary embodiments will be explained with reference to experiments and examples.

Examples and Comparative Examples

Etching compositions for Examples and Comparative Examples were prepared according to the following Tables 1 and 2. In Table 1, the unit of the content is wt % and the remainder of the etching compositions was water.

TABLE 1

|  | A1 | A2 | B | C | D | E1 | E2 | F | G |
|---|---|---|---|---|---|---|---|---|---|
| Example 1 | 24 | 23 | 3 | 9 | 8 | 3 | 3 | 3 | 0 |
| Example 2 | 20 | 20 | 3 | 9 | 8 | 3 | 3 | 3 | 0 |
| Example 3 | 30 | 25 | 3 | 9 | 8 | 3 | 3 | 3 | 0 |
| Example 4 | 24 | 23 | 1 | 9 | 8 | 3 | 3 | 3 | 0 |
| Example 5 | 24 | 23 | 4.9 | 9 | 8 | 3 | 3 | 3 | 0 |
| Example 6 | 24 | 23 | 3 | 8.1 | 8 | 3 | 3 | 3 | 0 |
| Example 7 | 24 | 23 | 3 | 9.9 | 8 | 3 | 3 | 3 | 0 |
| Example 8 | 24 | 23 | 3 | 9 | 1 | 3 | 3 | 3 | 0 |
| Example 9 | 24 | 23 | 3 | 9 | 15 | 3 | 3 | 3 | 0 |
| Example 10 | 24 | 23 | 3 | 9 | 8 | 1 | 1 | 3 | 0 |
| Example 11 | 24 | 23 | 3 | 9 | 8 | 5 | 5 | 3 | 0 |
| Example 12 | 24 | 23 | 3 | 9 | 8 | 3 | 3 | 1 | 0 |
| Example 13 | 24 | 23 | 3 | 9 | 8 | 3 | 3 | 5 | 0 |
| Comparative Example 1 | 19 | 19 | 3 | 9 | 8 | 3 | 3 | 3 | 0 |
| Comparative Example 2 | 31 | 26 | 3 | 9 | 8 | 3 | 3 | 3 | 0 |
| Comparative Example 3 | 24 | 23 | 0.5 | 9 | 8 | 3 | 3 | 3 | 0 |
| Comparative Example 4 | 24 | 23 | 6 | 9 | 8 | 3 | 3 | 3 | 0 |
| Comparative Example 5 | 24 | 23 | 3 | 7 | 8 | 3 | 3 | 3 | 0 |
| Comparative Example 6 | 24 | 23 | 3 | 11 | 8 | 3 | 3 | 3 | 0 |
| Comparative Example 7 | 24 | 23 | 3 | 9 | 0.5 | 3 | 3 | 3 | 0 |
| Comparative Example 8 | 24 | 23 | 3 | 9 | 16 | 3 | 3 | 3 | 0 |
| Comparative Example 9 | 24 | 23 | 3 | 9 | 8 | 0.5 | 0.5 | 3 | 0 |
| Comparative Example 10 | 24 | 23 | 3 | 9 | 8 | 6 | 6 | 3 | 0 |
| Comparative Example 11 | 24 | 23 | 3 | 9 | 8 | 3 | 3 | 0.5 | 0 |
| Comparative Example 12 | 24 | 23 | 3 | 9 | 8 | 3 | 3 | 6 | 0 |
| Comparative Example 13 | 24 | 23 | 3 | 9 | 8 | 3 | 3 | 3 | 1 |

TABLE 2

| Component | Name of component |
|---|---|
| A1 | Acetic acid |
| A2 | Citric acid |
| B | Methanesulfonic acid |
| C | Nitric acid |
| D | Sodium hydrogen sulfate |
| E1 | Imidazolidin-2,4-dione |
| E2 | Pyro-glutamic acid |
| F | Glycolic acid |
| G | Phosphoric acid |

Experiment 1—Evaluation of Etching Characteristics

A triple layer of ITO/Ag/ITO was formed on a glass substrate with a thickness of 70 Å/1,000 Å/50 Å, and a photoresist pattern was formed on the triple layer.

The triple layer was etched by the etching compositions according to Examples 1 to 13 and Comparative Examples 1 to 13. An etching ratio and a CD-skew, defined as a distance between an edge of the photoresist pattern and an edge of the ITO/Ag/ITO layer, were measured and represented in the following Table 3. Furthermore, in order to evaluate etching residue and precipitation, after a lower electrode for an organic light-emitting diode was formed according to the method illustrated in FIGS. 2 to 7, appearance of an etching residue and a surface of a connection pad formed from a triple layer of Ti/Al/Ti were observed.

TABLE 3

|  | Etching ratio (Å/sec) | CD-skew (at side, μm) | Etching residue | Precipitation |
|---|---|---|---|---|
| Example 1 | 20 | 0.210 | X | X |
| Example 2 | 20 | 0.245 | X | X |
| Example 3 | 22 | 0.292 | X | X |
| Example 4 | 20 | 0.210 | X | X |
| Example 5 | 22 | 0.265 | X | X |
| Example 6 | 20 | 0.241 | X | X |
| Example 7 | 22 | 0.284 | X | X |
| Example 8 | 20 | 0.222 | X | X |
| Example 9 | 22 | 0.284 | X | X |
| Example 10 | 22 | 0.288 | X | X |
| Example 11 | 20 | 0.237 | X | X |
| Example 12 | 20 | 0.238 | X | X |
| Example 13 | 22 | 0.281 | X | X |
| Comparative Example 1 | 16 | 0.167 | ○ | X |
| Comparative Example 2 | 26 | 0.416 | X | X |
| Comparative Example 3 | 17 | 0.179 | ○ | X |
| Comparative Example 4 | 24 | 0.362 | X | X |
| Comparative Example 5 | 16 | 0.160 | ○ | X |
| Comparative Example 6 | 24 | 0.360 | X | X |
| Comparative Example 7 | 18 | 0.183 | ○ | X |
| Comparative Example 8 | 24 | 0.327 | X | X |
| Comparative Example 9 | 24 | 0.371 | X | X |
| Comparative Example 10 | 17 | 0.175 | ○ | X |
| Comparative Example 11 | 16 | 0.160 | ○ | X |
| Comparative Example 12 | 26 | 0.460 | X | X |
| Comparative Example 13 | 26 | 0.444 | X | ○ |

Referring to Table 3, when the etching compositions of Examples 1 to 13 were used, etching residue and precipitation did not appear, and the etching ratios and the CD-skews were measured within appropriate ranges, which are respectively about 20 to 22 Å/sec and about 0.2 to 0.3 μm.

However, when the etching compositions of Comparative Examples 1, 3, 5, 7, 10 and 11 were used, etching residue appeared, and when the etching compositions of Comparative Examples 2, 4, 6, 8, 9 and 12 were used, the etching ratios and the CD-skews were not within the appropriate ranges. When the etching composition of Comparative Example 13 including phosphoric acid was used, precipitation of silver particles appeared.

Thus, it can be noted that excessively small amounts of the carboxylic acid compound, the sulfonic acid compound, the nitric acid, the glycol compound and the sulfate compound or excessively large amount of the nitrogen-containing dicarbonyl compound may cause etching residue, and that excessively large amounts of the carboxylic acid compound, the sulfonic acid compound, the nitric acid, the glycol compound and the sulfate compound or excessively small amount of the nitrogen-containing dicarbonyl compound may cause excessive increase of CD-skew. Furthermore, it can be noted that phosphoric acid may increase precipitation of particles.

Experiment 2—Evaluation of Reliability for Cumulative Use

A reference etching was performed by using the etching composition of Example 1, and test etchings were performed with adding silver powder. The obtained results were represented in the following Table 4. In Table 4, "O" represents that the amount of change to the reference etching is within 10%, and "X" represents that the amount of change to the reference etching is above 10%.

TABLE 4

| Content of silver powder | Etching ratio (Å/sec) | CD-skew (at side, μm) | Etching residue | Precipitation |
|---|---|---|---|---|
| Ref | O | O | O | O |
| 500 ppm | O | O | O | O |
| 1,000 ppm | O | O | O | O |
| 1,500 ppm | O | O | O | O |
| 2,000 ppm | O | O | O | O |

Referring to Table 4, change of etching characteristics was not large even when the content of silver ions was increased in the etching composition of Example 1.

Experiment 3—Evaluation of Reliability Over Time

A reference etching was performed by using the etching composition of Example 1, and test etchings were performed over time. The obtained results were represented in the following Table 5. In Table 5, "O" represents that the amount of change to the reference etching is within 10%, and "X" represents that the amount of change to the reference etching is above 10%.

TABLE 5

| Time | Etching ratio (Å/sec) | CD-skew (at side, μm) | Etching residue | Precipitation |
|---|---|---|---|---|
| Ref | O | O | O | O |
| 12 hour | O | O | O | O |
| 24 hour | O | O | O | O |
| 36 hour | O | O | O | O |
| 48 hour | O | O | O | O |
| 60 hour | O | O | O | O |
| 72 hour | O | O | O | O |

Referring to Table 5, change of etching characteristics for the etching composition of Example 1 was not large over time. Thus, it can be noted that the etching compositions according to exemplary embodiments has a higher reliability for cumulative use and over time.

By way of summation and review, a reflective electrode of the organic light-emitting display device may include silver (Ag). A silver-containing thin film may be etched by wet etching.

When the silver-containing thin film is etched by a general etching composition, there is a possibility that silver ions could be dissolved in the etching composition. The silver ions dissolved in the etching composition could adsorb to other metal patterns thereby forming a silver particle. The silver particle could be transferred to the reflective electrode in other processes thereby causing defects or failure in manufacturing processes.

Embodiments provide an etching composition, a method for forming a pattern using the etching composition, and a method for manufacturing a display device using the etching composition.

Exemplary embodiments may be used for etching a silver-containing thin film, a metal oxide thin film or a multiple layer including a silver-containing thin film and a metal oxide thin film. For example, exemplary embodiments may be used for forming wirings or electrodes, or for manufacturing various electronic devices including the wirings or the electrodes.

According to the exemplary embodiments, etching compositions may etch a multiple layer including a silver-containing thin film and a metal oxide thin film including indium oxide or the like, and may prevent damage of other metal layers including aluminum or the like, and may prevent reductive precipitation of silver particles.

The etching compositions may prevent etching residues and may form a CD-skew having appropriate length. In addition, the stability of the etching compositions for cumulative use and over time may be improved. Thus, defects in manufacturing processes for a display device may be reduced, and the reliability of the display device may be improved.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An etching composition, comprising an inorganic acid compound, a carboxylic acid compound, a sulfonic acid compound, a glycol compound, a nitrogen-containing dicarbonyl compound, a sulfate compound and water,
wherein the nitrogen-containing dicarbonyl compound includes imidazolidine-2,4-dione and pyro-glutamic acid.

2. The etching composition as claimed in claim 1, wherein the inorganic acid compound includes at least one selected from nitric acid ($HNO_3$), sulfuric acid ($H_2SO_4$) and hydrochloric acid (HCl).

3. The etching composition as claimed in claim 1, wherein the carboxylic acid compound includes at least one selected from acetic acid, ($CH_3CO_2H$), malic acid ($C_4H_6O_5$), citric acid ($C_6H_8O_7$), tartaric acid ($C_4H_6O_6$), lactic acid ($C_3H_6O_3$), formic acid ($CH_2O_2$), succinic acid ($C_4H_6O_4$) and fumaric acid ($C_4H_4O_4$).

4. The etching composition as claimed in claim 1, wherein the sulfonic acid compound includes at least one selected from methanesulfonic acid ($CH_3SO_3H$), p-toluenesulfonic acid ($CH_3C_6H_4SO_3H$), benzenesulfonic acid ($C_6H_5SO_3H$), amino methylsulfonic acid ($CH_5NO_3S$) and sulfamic acid ($H_3NSO_3$).

5. The etching composition as claimed in claim 1, wherein the glycol compound includes at least one selected from diethylene glycol ($C_4H_{10}O_3$), ethylene glycol ($HOCH_2CH_2OH$), glycolic acid ($CH_2OHCOOH$), propylene glycol ($C_3H_8O_2$) and triethylene glycol ($C_6H_{14}O_4$).

6. The etching composition as claimed in claim 1, wherein the nitrogen-containing dicarbonyl compound further includes at least one selected from iminodiacetic acid ($C_4H_7NO_4$), succinimide ($C_4H_5NO_2$), glutarimide ($C_5H_7NO_2$), asparagine ($C_4H_8N_2O_3$), glutamic acid ($C_5H_9NO_4$), aspartic acid ($C_4H_7NO_4$), and hippuric acid ($C_9H_9NO_3$).

7. The etching composition as claimed in claim 1, wherein the sulfate compound includes at least one selected from ammonium hydrogen sulfate ($(NH_4)HSO_4$), ammonium sulfate ($(NH_4)_2SO_4$), potassium hydrogen sulfate ($KHSO_4$), potassium sulfate ($K_2SO_4$), sodium hydrogen sulfate ($NaHSO_4$) and sodium sulfate ($Na_2SO_4$).

8. An etching composition, including:
   8.1 wt % to 9.9 wt % of an inorganic acid compound,
   40 wt % to 55 wt % of a carboxylic acid compound,
   1 wt % to 4.9 wt % of a sulfonic acid compound,
   1 wt % to 5 wt % of a glycol compound,
   2 wt % to 10 wt % of a nitrogen-containing dicarbonyl compound,
   1 wt % to 15 wt % of a sulfate compound, and
   water.

9. The etching composition as claimed in claim 1, wherein the etching composition is capable of etching a silver-containing thin film.

10. The etching composition as claimed in claim 1, wherein the etching composition is capable of etching a multiple layer structure including a silver-containing thin film and a metal oxide thin film, the metal oxide thin film including at least one selected from indium oxide, zinc oxide, tin oxide, indium tin oxide, indium zinc oxide and zinc tin oxide.

11. The etching composition as claimed in claim 1, wherein:
   the inorganic acid compound includes nitric acid,
   the carboxylic acid compound includes acetic acid and citric acid,
   the sulfonic acid compound includes methanesulfonic acid,
   the glycol compound includes glycolic acid, and
   the sulfate compound includes sodium hydrogen sulfate.

12. The etching composition as claimed in claim 1, wherein the imidazolidine-2,4-dione and the pyro-glutamic acid are included in a weight ratio of 2:1 to 1:2.

13. A method for forming a pattern, the method comprising:
   forming a multiple layer structure including a silver-containing thin film and a metal oxide thin film; and
   etching the multiple layer structure using an etching composition including an inorganic acid compound, a carboxylic acid compound, a sulfonic acid compound, a glycol compound, a nitrogen-containing dicarbonyl compound, a sulfate compound and water,
   wherein the sulfonic acid compound includes at least one selected from methanesulfonic acid ($CH_3SO_3H$), p-toluenesulfonic acid ($CH_3C_6H_4SO_2H$), benzenesulfonic acid ($C_6H_5SO_3H$), amino methylsulfonic acid ($CH_5NO_3S$) and sulfamic acid ($H_3NSO_3$).

14. The method as claimed in claim 13, wherein the multiple layer structure includes a lower layer including a metal oxide, an intermediate layer on the lower layer, the intermediate layer including silver or a silver alloy, and an upper layer on the intermediate layer, the upper layer including a metal oxide.

15. The method as claimed in claim 13, wherein the etching composition includes:
   8.1 wt % to 9.9 wt % of the inorganic acid compound,
   40 wt % to 55 wt % of the carboxylic acid compound,
   1 wt % to 4.9 wt % of the sulfonic acid compound,
   1 wt % to 5 wt % of the glycol compound,
   2 wt % to 10 wt % of the nitrogen-containing dicarbonyl compound,
   1 wt % to 15 wt % of the sulfate compound, and
   the remainder of water.

16. A method for manufacturing a display device, the method comprising:
   forming an active pattern in a display area on a base substrate;
   forming a gate metal pattern including a gate electrode overlapping the active pattern;
   forming a source metal pattern including a connection pad disposed in a peripheral area surrounding the display area;
   forming a multiple layer structure including a silver-containing thin film and a metal oxide thin film; and
   etching the multiple layer structure using an etching composition including an inorganic acid compound, a carboxylic acid compound, a sulfonic acid compound, a glycol compound, a nitrogen-containing dicarbonyl compound, a sulfate compound and water to form an electrode pattern in the display area and to expose the connection pad.

17. The method as claimed in claim 16, wherein the source metal pattern has a single-layer structure or a multiple-layer structure, which includes aluminum.

18. The method as claimed in claim 16, wherein the multiple layer structure includes:
   a lower layer including a metal oxide,
   an intermediate layer disposed on the lower layer and including silver or a silver alloy, and
   an upper layer disposed on the intermediate layer and including a metal oxide, wherein the metal oxide includes at least one selected from the group consisting of indium oxide, zinc oxide, tin oxide, indium tin oxide, indium zinc oxide and zinc tin oxide.

19. The method as claimed in claim 16, wherein the etching composition includes:
   8.1 wt % to 9.9 wt % of the inorganic acid compound,
   40 wt % to 55 wt % of the carboxylic acid compound,
   1 wt % to 4.9 wt % of the sulfonic acid compound,
   1 wt % to 5 wt % of the glycol compound,
   2 wt % to 10 wt % of the nitrogen-containing dicarbonyl compound,
   1 wt % to 15 wt % of the sulfate compound, and
   the remainder of water.

20. The method as claimed in claim 16, further comprising connecting a driving chip, which generates a driving signal, to the connection pad.

* * * * *